(12) United States Patent
Sakamoto

(10) Patent No.: US 6,316,296 B1
(45) Date of Patent: Nov. 13, 2001

(54) FIELD-EFFECT TRANSISTOR AND METHOD OF MANUFACTURING SAME

(75) Inventor: Kunihiro Sakamoto, Ibaraki (JP)

(73) Assignee: Agency of Industrial Science & Technology, Ministry of International Trade & Industry, Tokyo (JP)

(*) Notice: Subject to any disclaimer, the term of this patent is extended or adjusted under 35 U.S.C. 154(b) by 0 days.

(21) Appl. No.: 09/536,681

(22) Filed: Mar. 28, 2000

(30) Foreign Application Priority Data

May 28, 1999 (JP) .................................................. 11-149008

(51) Int. Cl.[7] .................................................. H01L 21/335
(52) U.S. Cl. .......................... 438/151; 438/157; 438/158
(58) Field of Search .................................. 438/157, 158, 438/151, 283

(56) References Cited

U.S. PATENT DOCUMENTS

| 4,396,930 | 8/1983 | Mizutani | 257/66 |
|---|---|---|---|
| 5,120,666 | 6/1992 | Gotou | 438/164 |

(List continued on next page.)

FOREIGN PATENT DOCUMENTS

| 62-001270 | 1/1987 | (JP) . |
|---|---|---|
| 3-54865 | 3/1991 | (JP) . |
| 3-155166 | 7/1991 | (JP) . |
| 3-266469 | 11/1991 | (JP) . |
| 4-334030 | 11/1992 | (JP) . |
| 340793-A | * 12/2000 | (JP) . |

OTHER PUBLICATIONS

Denton, J.P., et al., "Fully depleted dual–gated thin–film SOI P–MOSFET with an isolated buried polysilicon backgate", 1995. IEEE, pp. 135–136.*

Patent Abstracts of Japan, vol. 012, No. 089 (E–592), Mar. 23, 1998, JP 62 224079, Oct. 2, 1987.

Patent Abstracts of Japan, vol. 013, No. 268 (E–775), Jun. 20, 1989, JP 01 059864, Mar. 7, 1989.

J. P. Denton, IEEE Electron Device Letters, vol. 17, No. 11, pp. 509–511, "Fully Depleted Dual–Gated Thin–Film SOI P–MOSFET'S Fab Ricated in SOI Islands With an Isolated Buried Polysilicon Backgate", Nov. 1, 1996.

*Primary Examiner*—John F. Niebling
*Assistant Examiner*—Stacy A Whitmore
(74) *Attorney, Agent, or Firm*—Oblon, Spivak, McClelland, Maier & Neustadt, P.C.

(57) ABSTRACT

A dual gate structure field-effect transistor is manufactured by forming a trench in an SOI substrate comprised of a semiconductor support substrate, a buried insulation layer formed on the support substrate and an SOI semiconductor layer formed on the insulation layer, so as to extend from an upper surface of the SOI substrate through the SOI semiconductor layer and the buried insulation layer to the semiconductor support substrate, thereby dividing the SOI semiconductor layer into two SOI semiconductor layer regions that form a source electrode and a drain electrode; forming a gate electrode constituted of low resistance material in a portion of the trench in contact with the buried insulation layer, thereby self-aligning with the source electrode and drain electrode; forming a gate insulation layer on the gate electrode in contact with the buried insulation layer around the trench; forming a semiconductor conduction channel layer on the gate insulation layer in contact with the two SOI semiconductor layer regions around the trench; forming an upper gate insulation layer on an upper surface of the semiconductor conduction channel layer and a SOI semiconductor layer inside surface defining the trench; and forming an upper gate electrode in the trench so as to have a bottom surface and side surface covered by the upper gate insulation layer, thereby self-aligning with the gate electrode, source electrode and drain electrode.

6 Claims, 4 Drawing Sheets

U.S. PATENT DOCUMENTS

| | | | |
|---|---|---|---|
| 5,188,973 | | 2/1993 | Omura et al. ........................ 438/157 |
| 5,273,921 | * | 12/1993 | Neudeck .............................. 438/157 |
| 5,278,102 | | 1/1994 | Horie ................................... 438/164 |
| 5,296,727 | | 3/1994 | Kawai et al. ........................ 257/260 |
| 5,338,959 | | 8/1994 | Kim et al. ............................ 257/331 |
| 5,574,294 | * | 11/1996 | Shepherd .............................. 257/66 |
| 5,658,806 | * | 8/1997 | Lin ....................................... 438/157 |
| 5,736,435 | * | 4/1998 | Venkatesan ......................... 438/151 |
| 5,759,878 | * | 6/1998 | Hayashi ............................... 438/151 |
| 5,926,699 | * | 7/1999 | Hayashi ............................... 438/151 |
| 6,004,837 | * | 12/1999 | Gambino ............................. 438/157 |
| 6,207,530 | * | 3/2001 | Hsu ..................................... 438/404 |

\* cited by examiner

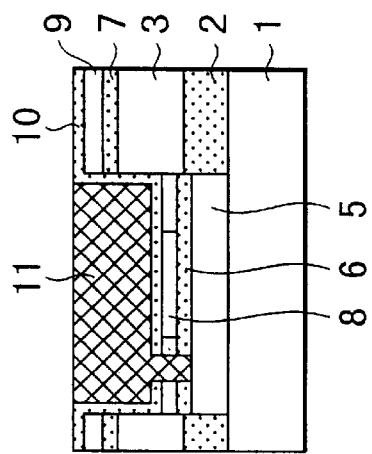
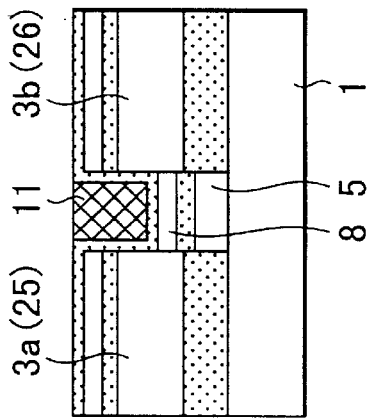
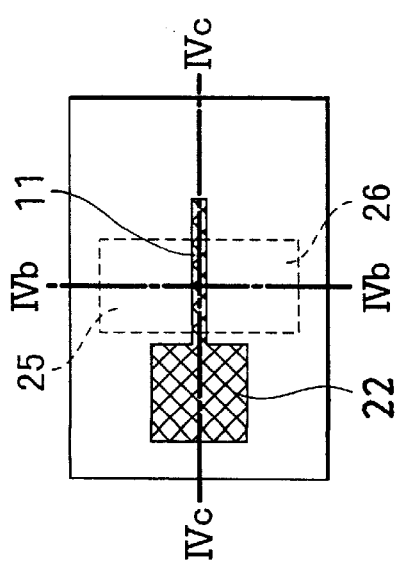
FIG. 4(a)  FIG. 4(b)  FIG. 4(c)
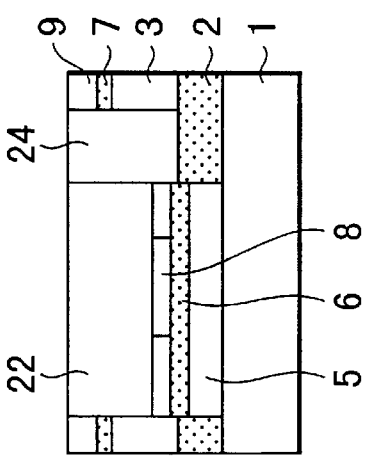
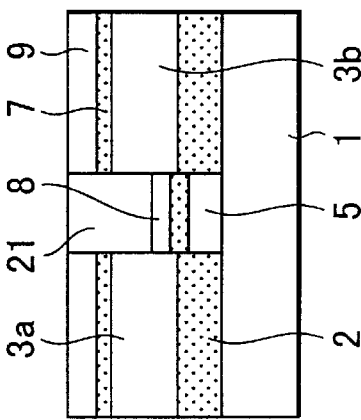
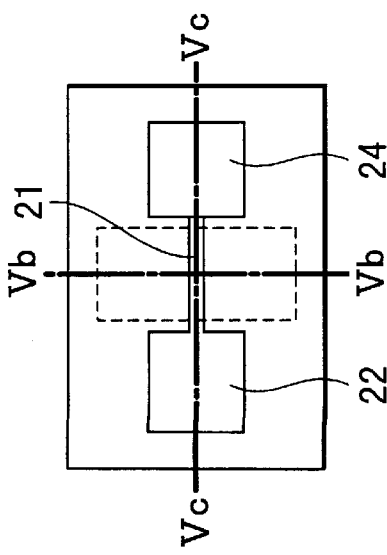
FIG. 5(a)  FIG. 5(b)  FIG. 5(c)

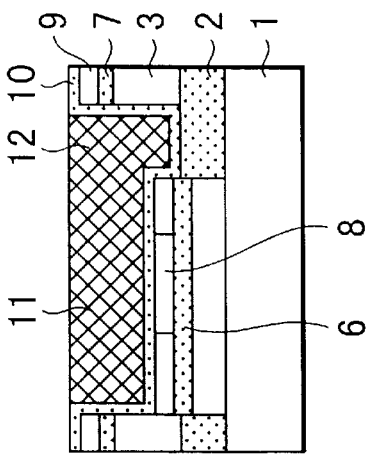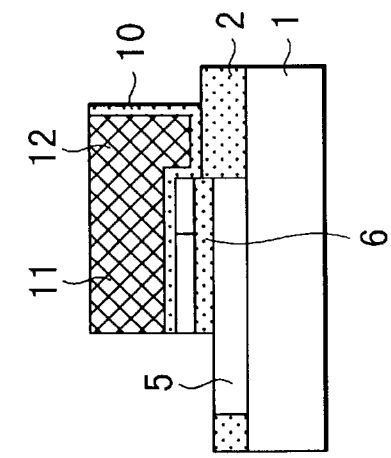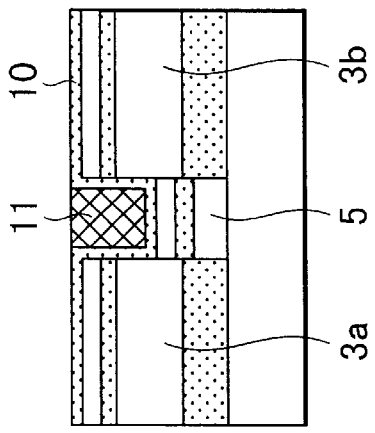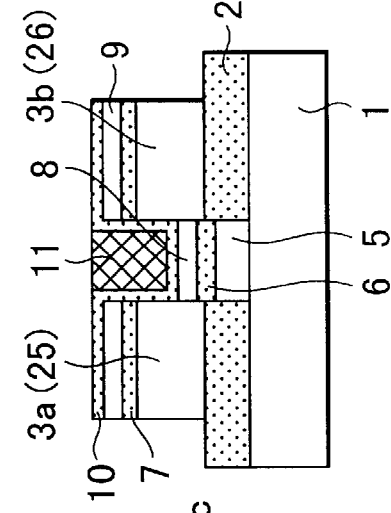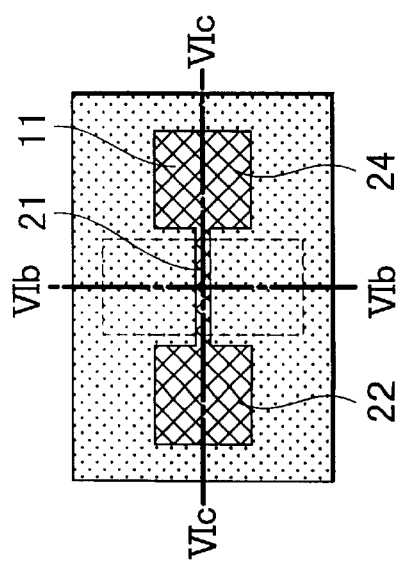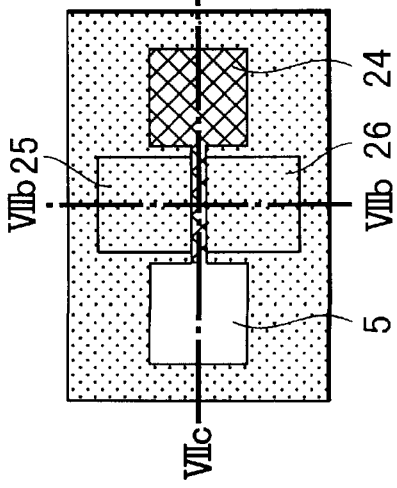

FIELD-EFFECT TRANSISTOR AND METHOD OF MANUFACTURING SAME

BACKGROUND OF THE INVENTION

1. Field of the Invention

This invention relates to a fine, high-performance dual gate field-effect transistor, and to a method of manufacturing the transistor.

2. Description of the Prior Art

As transistors become increasingly fine, it has given rise to a pronounced short channel effect in which fluctuations in gate length produce variations in threshold values. The use of a dual gate structure is known to be an optimum way of preventing the short channel effect (see Japanese Patent Publication Gazette No. 62-1270). However, as far as the present inventors know, no industrial method of fabricating a field-effect transistor with a dual gate structure has actually been proposed. In particular, no transistor has been proposed in which a group of an upper gate and a lower gate and another group of a source and a drain are self-aligning and the parasitic capacitance that hinders high-speed operation in a field-effect transistor is minimized, nor has a method of commercially producing such a transistor been proposed.

The reason for this is that in the prior art procedure used to fabricate a MOS transistor, a gate is fabricated in a first photolithography step and a source and a drain are formed using the gate as a mask so that the source and drain self-aligns with the gate. That is, the fact that there is no planar overlay between the gate and the source and between the gate and the drain is utilized.

However, when the gate comprises an upper and a lower gate, it is difficult to form the two gates so that they self-align. If, for example, the upper gate is formed first by the photolithography step, it is difficult to then form the lower gate, a source and a drain so that they align with the upper gate. This is because while one group of the upper and lower gates has to be formed as a planar overlay, another group of the source and drain has to be formed so that the another group does not overlay the one group, hence there is the difficulty in trying to use a single process to form both groups. Because of this difficulty, dual gate field-effect transistors are usually formed using two or more photolithography steps. However, the drawback with using two or more process steps is that the devices are more likely to be defective owing to errors in mask alignment.

This invention was accomplished to overcome the foregoing problems and has as an object to provide a fine, high-performance, self-aligning, dual gate field-effect transistor, and a method of commercially manufacturing the transistor.

SUMMARY OF THE INVENTION

For achieving this object, the invention provides a dual gate structure field-effect transistor comprising:
- an SOI substrate comprised of a semiconductor support substrate, a buried insulation layer formed on the support substrate and an SOI semiconductor layer formed on the insulation layer,
- a trench formed in the SOI substrate so as to extend from an upper surface of the SOI substrate through the SOI semiconductor layer and the buried insulation layer to the semiconductor support substrate, thereby dividing the SOI semiconductor layer into two SOI semiconductor layer regions that form a source electrode and a drain electrode,
- a gate electrode formed in the trench in contact with the buried insulation layer and the semiconductor support substrate, thereby self-aligning with the source electrode and drain electrode,
- a gate insulation layer formed on the gate electrode in contact with the buried insulation layer around the trench,
- a semiconductor conduction channel layer formed on the gate insulation layer in contact with the two SOI semiconductor layer regions around the trench,
- an upper gate insulation layer formed on an upper surface of the semiconductor conduction channel layer and a SOI semiconductor layer inside surface defining the trench, and
- an upper gate electrode formed in the trench so as to have a bottom surface and side surface covered by the upper gate insulation layer, thereby self-aligning with the gate electrode, source electrode and drain electrode.

The above object is also achieved by a method of manufacturing a dual gate structure field-effect transistor, comprising the steps of;
- forming a trench in an SOI substrate comprised of a semiconductor support substrate, a buried insulation layer formed on the support substrate and an SOI semiconductor layer formed on the insulation layer, so as to extend from an upper surface of the SOI substrate through the SOI semiconductor layer and the buried insulation layer to the semiconductor support substrate, thereby dividing the SOI semiconductor layer into two SOI semiconductor layer regions that form a source electrode and a drain electrode,
- forming a gate electrode constituted of low resistance material in a portion of the trench in contact with the buried insulation layer, thereby self-aligning with the source electrode and drain electrode,
- forming a gate insulation layer on the gate electrode in contact with the buried insulation layer around the trench,
- forming a semiconductor conduction channel layer on the gate insulation layer in contact with the two SOI semiconductor layer regions around the trench,
- forming an upper gate insulation layer on an upper surface of the semiconductor conduction channel layer and a SOI semiconductor layer inside surface defining the trench, and
- forming an upper gate electrode in the trench so as to have a bottom surface and side surface covered by the upper gate insulation layer, thereby self-aligning with the gate electrode, source electrode and drain electrode.

The method of manufacturing the field-effect transistor also includes, prior to forming the upper gate electrode, forming a gate extraction region on the SOI substrate that is connected with the trench and has an opening that extends to the gate electrode, and filling the gate extraction region with electrode material to form the upper gate electrode that electrically connects the gate electrode.

The method of manufacturing the field-effect transistor also includes, preceding the formation of the upper gate insulation layer, forming the gate extraction region by entrenching at a position where the gate extraction region abuts or overlays the gate electrode, so that the upper gate extraction region self-aligns.

The method of manufacturing the field-effect transistor also includes removing down to the buried insulation layer portions other than the source electrode, drain electrode, upper gate electrode and gate extraction region to expose the gate electrode.

Since the formation of the gate electrode and upper gate electrode is self-aligning, only one photolithography step is required, simplifying the fabrication process, thereby facilitating commercial fabrication while at the same time reducing costs. Also, since the formation of the two gate electrodes self-align, errors arising from mask misalignment are eliminated, so the product yield is improved. In addition, the self-alignment makes it possible to achieve a shorter gate length using the same lithographic feature dimension, improving transistor performance.

Further features of the invention, its nature and various advantages will become more apparent from the accompanying drawings and following detailed description of the invention.

BRIEF DESCRIPTION OF THE DRAWINGS

FIGS. 2, 3 and 4 show the structure and fabrication steps of another self-aligning, dual gate field-effect transistor of the invention when the gate electrode and upper gate electrode are electrically connected, in which FIGS. 2(a), 3(a) and 4(a) are plan views, and FIGS. 2(b), 3(b) and 4(b) and FIGS. 2(c), 3(c) and 4(c) are cross-sectional views along, respectively, lines IIb—IIb, IIIb—IIIb and IVb—IVb and lines IIc—IIc, IIIc—IIIc and IVc—IVc of FIGS. 2(a), 3(a) and 4(a).

FIGS. 5, 6 and 7 show the structure and fabrication steps of still another self-aligning, dual gate field-effect transistor of the invention in which the gate electrode and upper gate electrode have separate external electrical connections, with FIGS. 5(a), 6(a) and 7(a) showing plan views, and FIGS. 5(b), 6(b) and 7(b) and FIGS. 5(c), 6(c) and 7(c) showing cross-sectional views along, respectively, lines Vb—Vb, VIb—VIb and VIIb—VIIb and lines Vc—Vc, VIc—VIc and VIIc—VIIc of FIGS. 5(a), 6(a) and 7(a).

DESCRIPTION OF THE PREFERRED EMBODIMENT

Figure 1A:
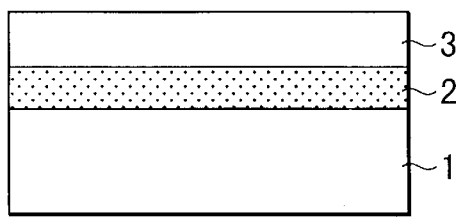
FIGS. 1(a) to 1(h) are cross-sectional views between the source and drain electrodes on each side of the semiconductor conduction channel, to show the structure of a self-aligning, dual gate field-effect transistor of the invention, and the steps of fabricating the transistor.

FIG. 1 shows cross-sectional views between the source and drain electrodes on each side of the semiconductor conduction channel to illustrate the structure of the self-aligning, dual gate field-effect transistor of the invention, and the steps of fabricating the transistor. The transistor shown is an n-channel silicon dual gate field-effect transistor comprising an SOI (Semiconductor On Insulator) semiconductor layer 3, a trench 4 that extends down from the surface of the SOI semiconductor layer 3 and through a buried insulation layer 2 to a semiconductor support substrate 1, a gate electrode 5 of single crystal silicon, a gate insulation layer 6 of silicon oxide, a semiconductor conduction channel layer 8 of recrystallized silicon, an upper gate insulation layer 9 of silicon oxide and an upper gate electrode 10 of polycrystalline silicon.

FIG. 1(a) shows an example of an SOI substrate of the field-effect transistor of the invention comprising the support substrate 1 of single crystal silicon, the insulation layer 2 of silicon oxide and the SOI semiconductor layer 3 of single crystal silicon. The SOI substrate can be fabricated by a conventional method. While this example is described with reference to an n-channel transistor, the SOI semiconductor layer 3 that forms the source and drain is a low resistance, high concentration n-type single crystal silicon and the support substrate 1 is p-type silicon. In the case of a p-channel transistor, high concentration p-type single crystal silicon is used for the SOI semiconductor layer 3 and n-type single crystal silicon for the support substrate 1. When n-channel and p-channel transistors coexist, selective addition of impurities is used to form the SOI semiconductor layer 3 in the n-channel transistor region of high concentration n-type single crystal silicon, and the portion thereof in contact with the buried insulation layer 2 on the support substrate 1 of p-type single crystal silicon, and to form the SOI semiconductor layer 3 in the p-channel transistor region of high concentration p-type single crystal silicon, and the support semiconductor substrate 1 of n-type single crystal silicon. When the buried insulation layer 2 is left after the process step of FIG. 1(b), selective addition of impurities is used to form the SOI semiconductor layer in the n-channel transistor region of high concentration n-type single crystal silicon, and to form the SOI semiconductor layer in the p-channel transistor region of high concentration p-type single crystal silicon. In this case the support semiconductor substrate 1 can be either n-type or p-type.

Figure 1B:
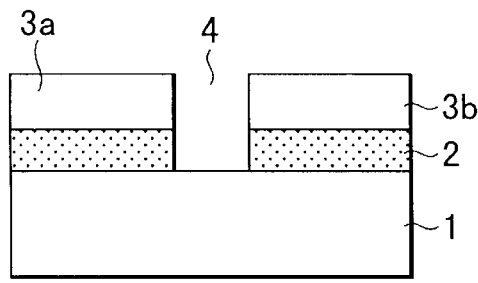

Next, with reference to FIG. 1(b), the portion of the SOI semiconductor layer 3 and buried insulation layer 2 that will form the gate is removed to form the trench 4 extending down to the support substrate 1. The invention can also be applied to when the portion of the buried insulation layer where the gate is to be formed is not completely removed so that the support substrate 1 is not exposed.

Figure 1C:
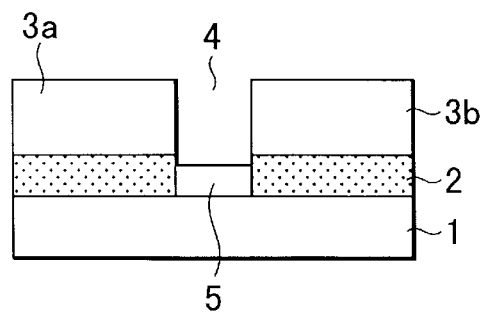

The SOI semiconductor layer 3 is divided into the two regions 3a and 3b by the formation of the trench 4. Low resistance material is used to form the gate electrode 5 in the portion of the trench 4 in contact with the buried insulation layer 2, as shown in FIG. 1(c). The gate electrode 5 is formed to a thickness whereby the gate electrode 5 is insulated from the regions 3a, 3b of the SOI semiconductor layer 3 when the gate insulation layer 6 is formed in the next step. In this example in which an n-channel transistor is fabricated, starting from the support semiconductor substrate 1 exposed in the step of FIG. 1(b), the gate electrode 5 is formed by epitaxially growing low resistance, high concentration n-type single crystal silicon. At the same time, a layer of low resistance, high concentration n-type single crystal silicon 7 is also epitaxially grown on the SOI semiconductor layer regions 3a and 3b, so the thickness of the low resistance, high concentration SOI semiconductor layer regions 3a and 3b is increased by an amount that is the thickness of the gate electrode 5. In this example the gate electrode 5 and support substrate 1 are in contact, but as p-type semiconductor has been selected for the support substrate 1, the gate electrode and support substrate are electrically insulated by a pn junction. When in the step of FIG. 1(b) used to form the trench 4 not all of the buried insulation layer 2 is removed, the gate electrode and support substrate can be electrically insulated, but it is difficult to form the gate electrode of single crystal silicon. However, even in this case the gate electrode on the buried insulation layer may be of polycrystalline silicon, which is easy to form, or of metal, or of a planar lamination of both.

Figure 1D:
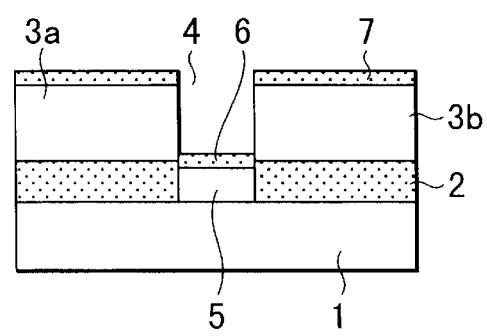

After thus forming the gate electrode 5, the gate insulation layer 6 is formed on the gate electrode, as shown in FIG. 1(d). The gate insulation layer 6 is formed so that it is in contact with the buried insulation layer 2 around the trench 4 and electrically insulates the gate electrode from the SOI semiconductor layer regions 3a and 3b. An insulation layer is not formed on the side walls of the SOI semiconductor layer regions in the trench 4. In this example high concentration n-type single crystal silicon of the gate electrode is oxidized to form a gate insulation layer of silicon oxide. Simultaneously, an insulation layer 7 of silicon oxide is formed on the SOI semiconductor layer regions 3a and 3b. An oxidation prevention layer such as silicon nitride or the like is formed beforehand on the side walls of the SOI semiconductor layer 3 so that the side walls of the SOI semiconductor layer do not become oxidized. After oxidation the oxidation prevention layer is removed from the side walls.

Figure 1E:
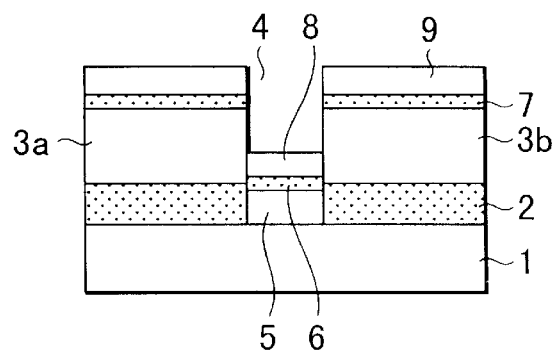

As shown in FIG. 1(e), the semiconductor conduction channel layer 8 is then formed on top of the gate insulation layer 6 to electrically connect the two SOI semiconductor layer regions 3a and 3b. With one of the SOI semiconductor layer regions 3a and 3b forming a source 25 [FIG. 1(h)] and the other a drain 26 [FIG. 1(h)], a field-effect transistor structure is thus formed in which the semiconductor conduction channel layer 8 and gate electrode 5 are self-aligned. In this example, the semiconductor conduction channel layer 8 is crystalline silicon formed by using the SOI semiconductor layer as the seed in solid phase growth to recrystallize amorphous silicon deposited on the gate insulation layer 6. Amorphous silicon is also deposited simultaneously on the SOI semiconductor layer, but because it is not in contact with the single crystal silicon that forms the recrystallization seed, it becomes polycrystalline.

Figure 1F:
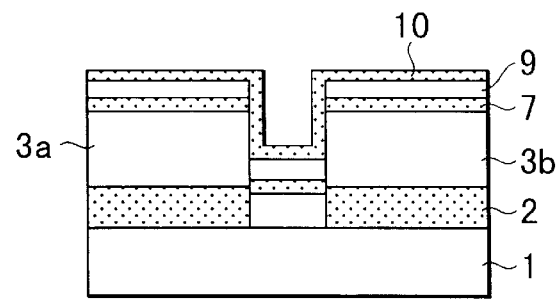

As shown in FIG. 1(f), the upper gate insulation layer 10 is then formed over the upper surface of the semiconductor conduction channel layer 8 and the inside walls of the SOI semiconductor layer regions 3a and 3b defining the trench 4. In this example, the upper surface of the crystalline silicon semiconductor conduction channel layer 8 and the inside walls of the high concentration, n-type single crystal silicon SOI semiconductor layer regions 3a and 3b are oxidized to form the upper gate insulation layer 10 of silicon oxide. The polycrystalline silicon on the SOI semiconductor layer regions 3a and 3b is also oxidized at the same time to form an insulation layer.

Figure 1G:
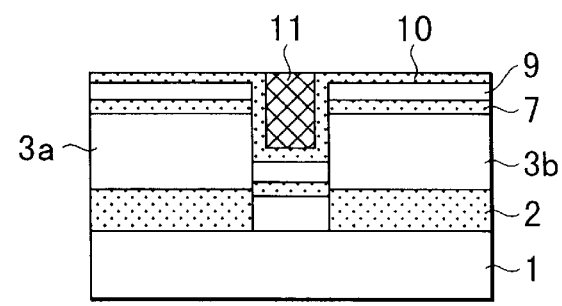
Figure 1H:
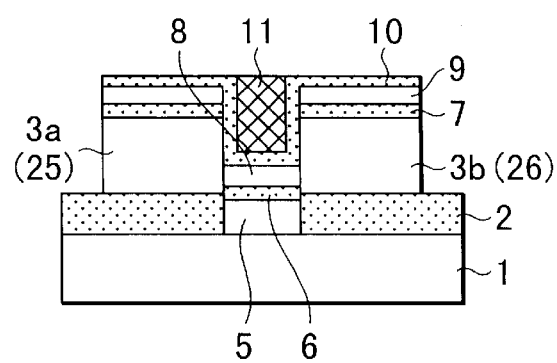

Next, as shown in FIG. 1(g), an upper gate electrode 11 is formed on the portion of the upper gate insulation layer 10 covering the inside of the trench 4. With this step, a dual gate field-effect transistor structure is formed in which the gate electrode 5 and upper gate electrode 11 are self-aligned. In this example, low resistance, high concentration n-type polycrystalline silicon is formed over the entire surface and the level surface portion removed, leaving just the portion of the high concentration n-type polycrystalline silicon in the trench 4 to form the upper gate electrode 11. The upper gate electrode 11 can be formed of polycrystalline silicon, or of metal, or of a planar lamination of both.

Finally, the portions that are not required, which are the portions other than the transistor element regions, are removed down to the buried insulation layer 2, whereby the adjacent transistor elements are electrically insulated by the buried insulation layer 2 therebetween. Thus, there is obtained a self-aligning, dual gate field-effect transistor in which of the SOI semiconductor layer regions 3a and 3b separated by the gate electrodes 5 and 11, one, SOI semiconductor layer region 3a, forms a source 25, and the other, SOI semiconductor layer region 3b, forms a drain 26.

FIGS. 2, 3 and 4 show an example of the structure of a self-aligning, dual gate field-effect transistor of the invention in which the gate electrode 5 and upper gate electrode 11 are electrically connected, and of a gate extraction region forming method.

Figure 2C:
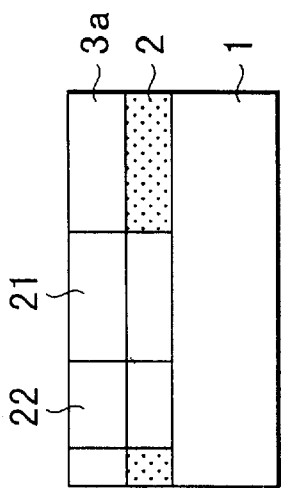
Figure 2B:
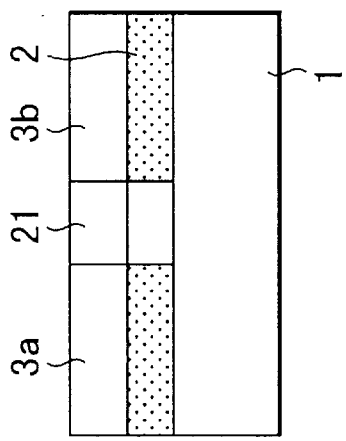
Figure 2A:
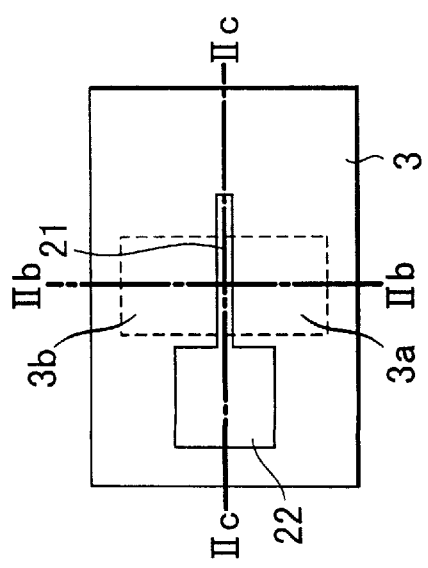

FIG. 2 shows the steps of the process corresponding to the step shown in FIG. 1(b), comprising forming an integral trench on the SOI substrate, that mutually connects the positions at which a gate electrode forming region 21 and a gate extraction region 22 are formed, dividing the SOI semiconductor layer 3 into two regions 3a and 3b. FIG. 2(a) is a plan view of the above, FIG. 2(b) is a cross-sectional view along line IIb—IIb of FIG. 2(a) and FIG. 2(c) is a cross-sectional view along line IIc—IIc of FIG. 2(a).

To make the drawing easier to view, the gate region is drawn wider than in FIG. 1(a) (this also applies hereinbelow to cross-sectional views of FIGS. 3 to 7).

Figure 3C:
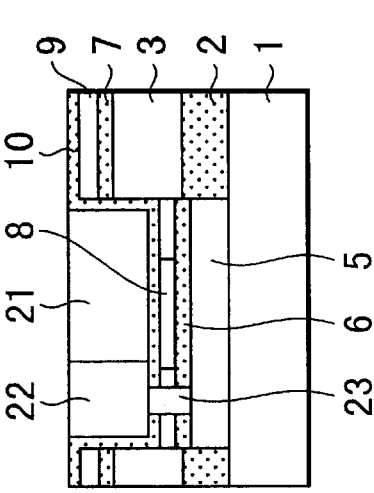
Figure 3B:
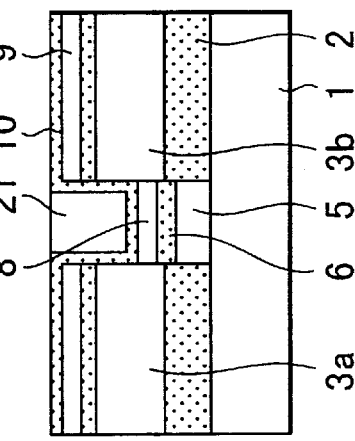
Figure 3A:
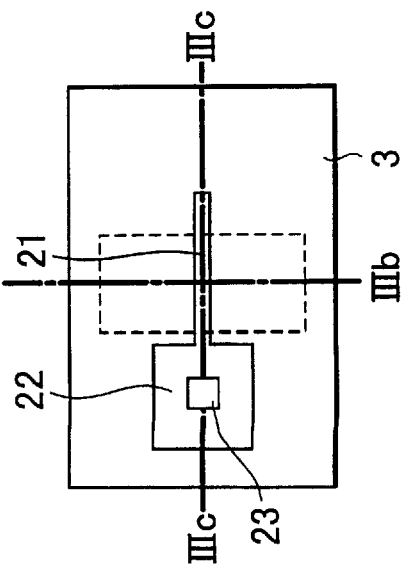

Next, to form the gate electrode 5 in the integral trench, low resistance, high concentration n-type single crystal silicon is epitaxially grown, and the gate electrode 5 and SOI semiconductor layer 3 are then covered by insulation layers 6 and 7 of silicon oxide as shown in FIG. 3. Channel layer 8 is then formed on the insulation layer 6 to electrically connect the two SOI semiconductor layer regions 3a and 3b defining the trench. Then, a polycrystalline layer 9 is formed on the insulation layer 7. As shown in the plan view of FIG. 3(a) and the cross-sectional view of FIG. 3(c), a portion of the gate extraction region 22 is removed to form an opening 23 that exposes part of the gate electrode 5. FIG. 3(b) is a cross-sectional view along line IIIb—IIIb of FIG. 3(a).

Next, as shown in FIG. 4(c), the opening 23, gate electrode forming region 21 and gate extraction region 22 are filled with gate electrode material. As a result, self-aligning formation of the upper gate electrode 11 that is electrically connected with the gate electrode 5 within the integral trench is also achieved. The gate electrode 5 and upper gate electrode 11 can be electrically connected by providing a wiring line from the gate extraction region 22 of the upper gate electrode 11 to an external circuit. FIG. 4(a) is a plan view of the two electrodes thus formed and FIG. 4(b) is a cross-sectional view along line IVb—IVb of FIG. 4(a), Reference numeral 25 denotes the source and numeral 26 denotes the drain.

As can be seen from the foregoing, the area occupied by the self-aligning, dual gate field-effect transistor of this invention is the same as that of a prior art field-effect transistor having just an upper gate. Thus, using the dual gate structure makes it possible to prevent an increase in the area occupied by the field-effect transistor.

FIGS. 5, 6 and 7 show an example of the structure of the self-aligning, dual gate field-effect transistor of the invention in which the gate electrode and upper gate electrode are separately connected to an external circuit, and an example of a gate extraction region forming method. As in the example shown in FIG. 1, a trench is formed on the SOI substrate integrally with the gate electrode forming region 21 and gate extraction region 22, dividing the SOI semiconductor layer into the two regions 3a and 3b. The gate electrode 5 is then formed in the trench by epitaxially growing low resistance, high concentration n-type single crystal silicon, and the gate electrode 5 and SOI semiconductor layer regions 3a and 3b are then covered respectively by insulation layers 6 and 7 of silicon oxide. By then forming a channel layer 8 on the insulation layer 6, the upper gate extraction region 24 is entrenched down to the upper surface of the buried insulation layer 2. The upper gate extraction region 24 is formed abutting or overlapping the gate electrode forming region 21.

FIG. 5(a) is a plan view of the entrenchment of the gate extraction regions 22 and 24, and FIG. 5(b) is a cross-sectional view along line Vb—Vb of FIG. 5(a).

After the integral trench comprising the regions 21, 22 and 24 is covered by the upper gate insulation layer 10, it is filled with gate electrode material, as shown in FIG. 6. As a result, the upper gate electrode 11 is self-aligned with the gate electrode forming region 21, gate extracting region 22 and upper gate extraction region 24.

Finally, as shown in FIG. 7, portions other than the source 25, drain 26, gate electrode forming region 21 and upper gate electrode extraction region 24 are removed down to the buried insulation layer 2, thereby exposing the gate electrode 5 of the gate extraction region 22 in a self-aligning way. The gate electrode 5 and upper gate electrode 11 can each be connected to an external circuit by providing each of the gate extraction region 22 and upper gate extraction region 24 thus formed with a wiring line to an external circuit.

In the above-described self-aligning, dual gate field-effect transistor of the invention, the overlapping of gate electrode and upper gate extraction region minimizes the area required. This also makes it possible to minimize the parasitic capacitance between the gate electrode and the upper gate electrode that becomes a problem when different signal voltages are applied to the gate electrodes.

As can be understood from the foregoing, by focusing on the fact that even if the gate is divided vertically into two, the source and drain are still one set, and reversing the prior art procedure by forming the source and drain first, and then forming the upper and lower gates and trench in alignment therewith, it was possible to realize a dual gate field-effect transistor that is self-aligning using a single photolithography step. As a result, the fabrication process is simplified, making it feasible to commercially manufacture dual gate field-effect transistors. Moreover, since the two gates are formed by self-alignment, errors arising from mask misalignment are eliminated, improving the product yield. In addition, the self-alignment makes it possible to achieve a shorter gate length using the same lithographic feature dimension. As a result, transistor performance is improved, and the source/drain and gate are overlaid, minimizing parasitic capacitance, enabling the production of transistors that exhibit high-speed, stable operation.

What is claimed is:

1. A method of manufacturing a dual gate structure field-effect transistor, comprising the steps of:

forming a trench in an SOI substrate comprised of a semiconductor support substrate, a buried insulation layer formed on the support substrate and an SOI semiconductor layer formed on the insulation layer, so as to extend from an upper surface of the SOI substrate through the SOI semiconductor layer and the buried insulation layer to the semiconductor support substrate, thereby dividing the SOI semiconductor layer into two SOI semiconductor layer regions that form a source electrode and a drain electrode, forming a gate electrode constituted of low resistance material in a portion of the trench in contact with the buried insulation layer, thereby self-aligning with the source electrode and drain electrode, forming a gate insulation layer on the gate electrode in contact with the buried insulation layer around the trench, forming a semiconductor conduction channel layer on the gate insulation layer in contact with the two SOI semiconductor layer regions around the trench, forming an upper gate insulation layer on an upper surface of the semiconductor conduction channel layer and a SOI semiconductor layer inside surface defining the trench, and forming an upper gate electrode in the trench so as to have a bottom surface and side surface covered by the upper gate insulation layer, thereby self-aligning with the gate electrode, source electrode and drain electrode.

2. A method according to claim 1, wherein the low resistance material constituting the gate electrode is formed of a semiconductor of a conduction type that is different from that of the semiconductor support substrate.

3. A method according to claim 1, wherein the trench extends into the buried insulation layer.

4. A method according to claim 1, further comprising prior to forming the upper gate electrode, forming on the SOI substrate a gate extraction region having an opening that extends to the gate electrode, and is connected with the trench and filled with electrode material to form the upper gate electrode that electrically connects the gate electrode.

5. A method according to claim 4, wherein prior to forming the upper gate insulation layer, the gate extraction region is formed by entrenching at a position where the upper gate extraction region abuts the gate electrode, so that the upper gate electrode self-aligns.

6. A method according to claim 4, wherein prior to forming the upper gate insulation layer, the gate extraction region is formed by entrenching at a position where the upper gate extraction region overlays the gate electrode, so that the upper gate electrode self-aligns.

* * * * *